United States Patent [19]

Martinez Garcia et al.

[11] Patent Number: 5,553,077
[45] Date of Patent: Sep. 3, 1996

[54] METHOD AND DEVICE FOR AUTOMATIC SYNCHRONISATION OF DATA BURSTS

[75] Inventors: Francisco J. Martinez Garcia, Madrid; Francisco Diaz Molina, Portal, both of Spain

[73] Assignee: Alcatel N.V., Rijswijk, Netherlands

[21] Appl. No.: 364,129

[22] Filed: Dec. 27, 1994

[30] Foreign Application Priority Data

Dec. 31, 1993 [ES] Spain ................................ 9302743

[51] Int. Cl.$^6$ ........................ H04B 7/212; H04J 3/06
[52] U.S. Cl. .................. 370/95.3; 370/105.3; 375/356; 375/371; 379/61; 455/54.1; 455/67.6
[58] Field of Search ................... 370/95.1, 95.3, 370/100.1, 103, 104.1, 105.1, 105.3, 105.5, 108; 375/354, 355, 356, 359, 364, 371; 379/58, 61; 455/49.1, 51.1, 53.1, 54.1, 56.1, 67.1, 67.6

[56] References Cited

U.S. PATENT DOCUMENTS

| | | | |
|---|---|---|---|
| 4,346,470 | 8/1982 | Alvarez, III et al. | 370/104.1 |
| 4,504,946 | 3/1985 | Raychaudhuri | 370/95.3 |
| 4,941,155 | 7/1990 | Chuang et al. | 375/354 |
| 5,072,445 | 12/1991 | Nawata | 370/104.1 |
| 5,229,996 | 7/1993 | Backstrom et al. | 370/100.1 |
| 5,309,439 | 5/1994 | Roos | 370/95.3 |

FOREIGN PATENT DOCUMENTS

| | | |
|---|---|---|
| 0474138 | 3/1992 | European Pat. Off. . |
| 0507384 | 10/1992 | European Pat. Off. . |
| 0511614 | 11/1992 | European Pat. Off. . |
| 2254226 | 9/1992 | United Kingdom . |
| 9210884 | 6/1992 | WIPO . |

*Primary Examiner*—Alpus H. Hsu
*Attorney, Agent, or Firm*—Ware, Fressola, Van Der Sluys & Adolphson

[57] ABSTRACT

A method and device for automatic synchronization of data bursts that is applicable to cordless communications systems with time division multiple access, TDMA, for synchronizing the timebases of cordless terminals and base stations. This device, which periodically receives for a short interval of time, a burst reception signal (A) to be synchronized, incorporates a register (1) which stores the value of a counter (3) when the burst reception signal (A) is high and subtracts from it, in an adder circuit (2), a reference value (REF) in order to adjust the references between the two timebases. To the output value (DELTA), a maximum value (MAX) is added or subtracted in a second adder circuit (4), depending on what timebase, the internal or the reference one, is faster. The device's output is compared with that of the counter (3) in a comparator (5) and the output (T) from the comparator is applied to a control circuit (6) that determines the module in the counter (3) for lengthening or shortening the burst to achieve synchronism.

6 Claims, 3 Drawing Sheets

METHOD AND DEVICE FOR AUTOMATIC SYNCHRONISATION OF DATA BURSTS

TECHNICAL FIELD

This invention concerns a device which, with an externally generated data signal, produces the automatic synchronisation of the timebase generated internally by a cordless terminal in order to permit communications with a base station by means of time division multiple access techniques.

This invention is of particular application in those cordless receivers which, with a minimum power consumption, have to lock on to the timebase generated in the base station with which they are communicating so that, in this way, they are in condition to send and receive bursts at any moment without losing the bursts and without causing collisions with bursts coming from other terminals or from the base station itself.

BACKGROUND OF THE INVENTION

In many modern cordless communications systems, use is made of time division multiple access techniques, TDMA, in which both the base station and the cordless terminal have to send and receive bursts of information in a perfectly defined time slot so that they are able to communicate with each other without loss of bursts and without interfering with other channels located in different time slots.

For this reason both parts must have a common timebase that makes this possible.

The manner in which this common timebase is normally achieved is that the base station generates a timebase, termed master timebase, while the cordless terminal has a timebase, termed slave timebase, that has to lock on to that of the base station. This locking is necessary because drifting between the two timebases occurs as a result of using different oscillators to generate them.

To produce the necessary synchronisation between the timebases of the base station and of the cordless terminal, the latter has to "listen" continuously the base station and to continuously compensate for any small shifts that occur in its own timebase, so that when it has to receive or send a burst, the timebases of both parts are already synchronised and communication can take place between the two parts without problems resulting from a lack of burst synchronisation.

The fact that there are some periods of time during which the cordless terminal is not receiving bursts generated in the base station is not important if these are not long enough such that the drift between the two timebases when bursts from the base station are received once again, makes correct resynchronisation impossible.

It is therefore necessary for the cordless terminal to be permanently "listening" the base station, resulting in an unnecessary current consumption that has a major impact on the duration of the terminal batteries. This is particularly important for the so-called pocket terminals, the batteries of which must have considerable autonomy.

This problem becomes especially significant when the terminal is used infrequently, and it can occur that the batteries become discharged after a certain number of hours even without the user having actively employed the terminal.

TECHNICAL PROBLEM TO BE OVERCOME

As a consequence of the state of the art described above, the technical problem to be overcome lies in maintaining synchronism between the timebases generated in the base station and in each of the cordless terminals in a wireless communications system, with a power consumption so low that it is possible to achieve a terminal autonomy of long duration.

SUMMARY OF THE INVENTION

The device according to the invention compensates internal timebase drift in a cordless terminal with respect to an external reference. This internal timebase is generated by a counter that maintains a count of the bit considered by this timebase within each time slot that constitutes the frame and by a control circuit that carries out the control of the timebase in question.

This device is characterised in that it receives, in periodic form and for only a short interval of time, a data signal which prompts it to produce a burst reception signal with which it has to synchronise its own internal timebase.

In order to perform this process, the device includes a storage register that stores the output signal from the counter at the moment when the burst reception signal is received with an active level. It also incorporates a first adder which subtracts the content of the storage register from a reference value that indicates the bit, within each time slot, when the burst reception signal is active. The output of this adder, indicates the shift, expressed as a number of bits, between the external reference timebase and the internal timebase of the device.

It also has a second adder which, by means of a sum or a difference between a maximum value corresponding to the number of bits of the time slots and the output value of the first adder, obtains the value to be reached by the counter that forms part of the timebase so that, for the next burst, both timebases, the internal and the external reference, are synchronised.

The function is a sum or a difference, depending on whether the internal timebase was faster or slower than the external reference timebase, this being detected by the control circuit, whereby, in some later time slot, its duration is increased or shortened in order to bring it into synchonisation with the external reference. For this, use is made of a comparator which compares the output from the second adder with that of the counter which forms part of the internal timebase. The output of this comparator is sent to the control circuit to inform it when the counter has reached the value of the second adder in order to proceed to initialise the counting process in the latter and thereby lengthening or shortening the normal count value for synchronising the internal timebase with the external reference generated in the corresponding base station.

For a low current consumption, this device permits synchronisation between the timebases in cordless terminals and base stations in systems with time division multiple access, TDMA; thereby making communications between the two parts possible.

BRIEF DESCRIPTION OF THE FIGURES

A fuller explanation is given in the description of the invention, based on the figures attached, in which.

BEST MODE FOR CARRYING OUT THE INVENTION

Figure 1:
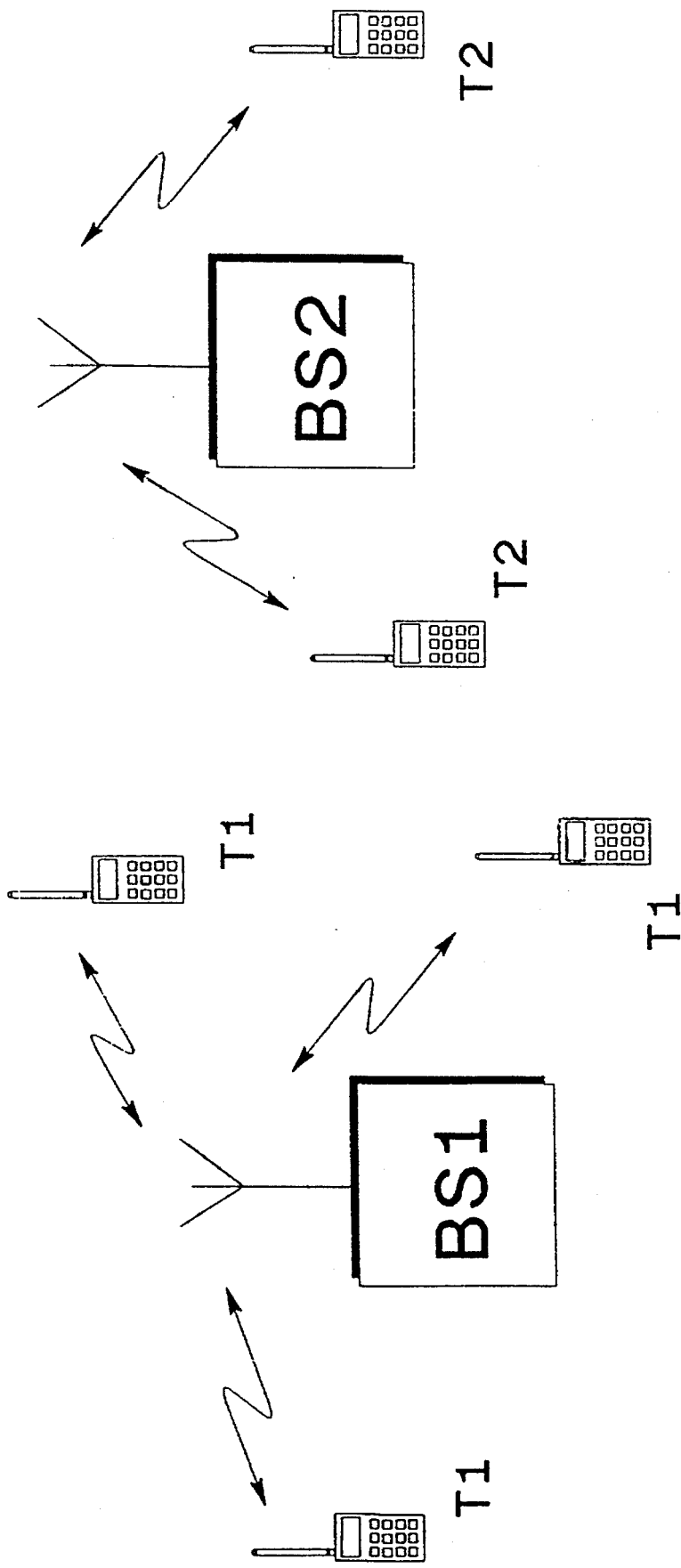
FIG. 1 shows a cordless communications system in which this invention is applied.

This invention was specially developed for a cordless communications system as shown in FIG. 1 which makes use of time division multiple access, TDMA, techniques. In this system, base stations BS1, BS2 permit a set of cordless terminals T1, T2 to have access to a communications network.

Both parts, the base stations BS1, BS2 and the cordless terminals T1, T2 have to maintain a common timebase, at least for each assembly formed by a base station and its associated cordless terminals, so that each one knows when it has to prepare to receive information and when it has to transmit it without producing overlapping of bursts coming from different sources.

For this reason, each piece of equipment (each base station and each cordless terminal) generates a timebase in such a way that the timebase generated by each base station is considered to be the master or reference, and the terminals associated with this station must be synchronised with it.

In simplified terms, the timebases are constituted by a cyclic counter 3 that counts the bits of each time slot, and a control circuit 6 that monitors which is the pertinent slot in the frame.

As has been mentioned when discussing the state of the art, the normal situation is that the cordless terminals are continuously "listening" to the base station, thereby permitting the terminals to keep their timebases locked on continuously, considering that in the half-frame during which the base stations are not transmitting (corresponding to the terminals), drifting is very slight and the terminals can immediately lock in once again.

This solution requires a constant power consumption from the batteries of the mobile terminals, even in the event that the terminal is never used to establish a communication. This is why in the terminals, in accordance with the invention, the receiver is kept off for the greater part of the time while the internal timebase of the corresponding cordless terminal runs freely and, consequently, because of inherent drift, the terminal timebase gradually shifts with respect to that of the base station to which it belongs, as can be seen from FIG. 2.

In this figure, frame 21 is equivalent to the timebase generated by the base station considered to be the master. Signal 22 corresponds to the burst reception signal A that is active in the bit following the reception of the burst header and, consequently, the active level is shifted by a certain number of bits with respect to the first bit.

Signals 23 and 25 respectively show the situations in which the internal timebase of the cordless terminals is faster or slower than the external reference produced by the base station.

Periodically, and in order to restrict the amount of drift, the receiver of the terminal in question comes on for a few moments, sufficient in duration to resynchronise its internal timebase with the base station timebase, by means of the device according to the invention.

Figure 3:
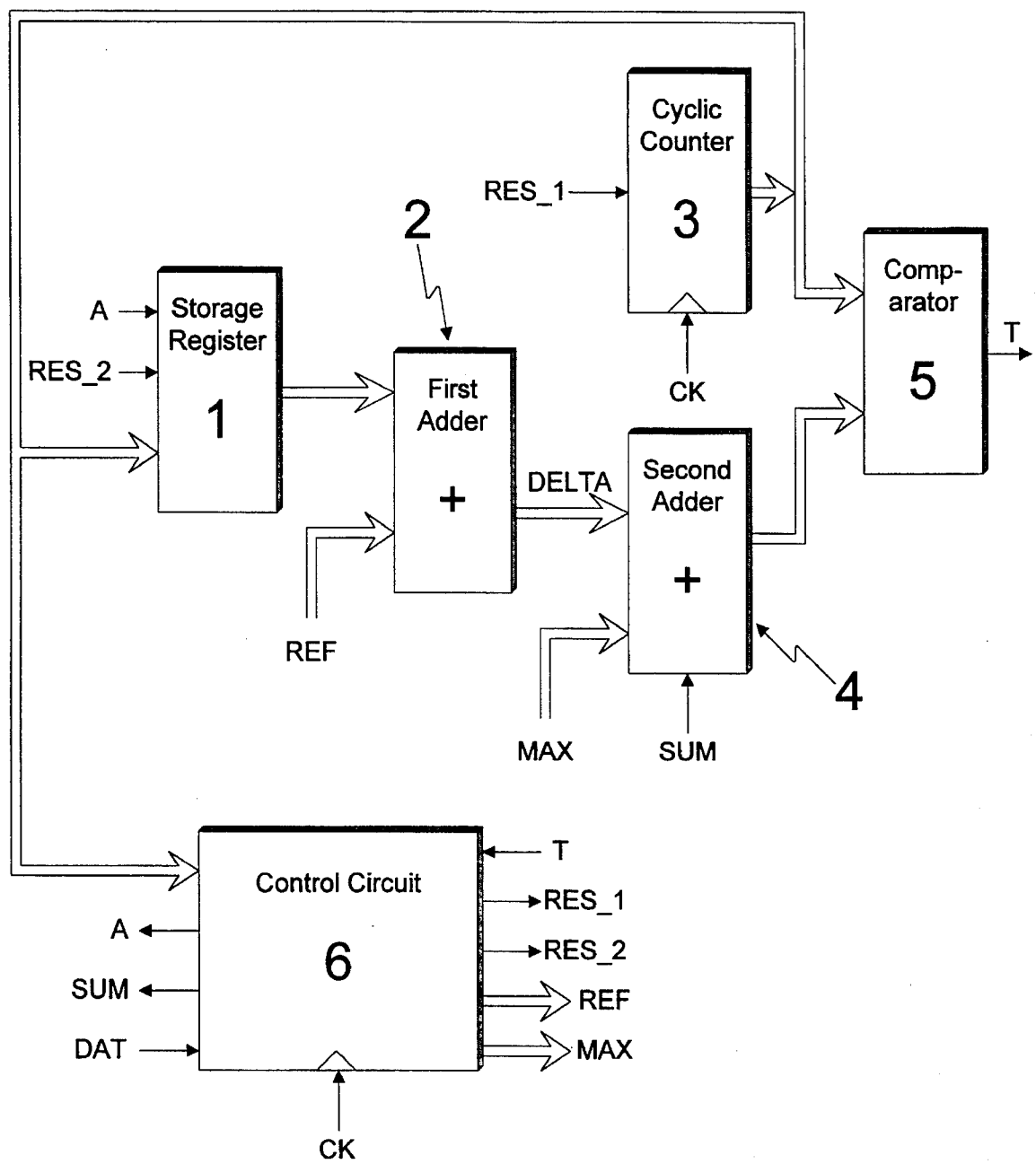
FIG. 3 shows the block diagram of a data burst synchronisation device according to the invention.

For this, the control circuit 6, shown in FIG. 3, that receives the data signal DAT coming from the receiver, generates a burst reception signal A, which has an active level when the burst header is detected in a time window that is sufficiently wide to allow for the maximum drifts produced from the last time that synchronisation took place. This burst reception signal is logically produced, at the earliest, in the last bit of the header of the bursts.

The burst synchronisation device, therefore, stores in a storage register 1 the value of the counter 3 of the timebase and subtracts it, in a first adder 2, from a reference value REF which is the bit in which the burst reception signal A is generated. This first adder 2 produces an output DELTA that is the shift, expressed as a number of bits, between the two timebases, the internal one of the cordless terminal and the external reference coming from the base station.

It also has a second adder 4 that can perform the addition or subtraction, depending on an add control signal SUM, of a maximum value MAX which is the number of bits that comprises each complete burst and the output signal DELTA from the first adder 2. This add control signal SUM indicates addition if the internal timebase is delayed with respect to the external reference, or subtraction in the opposite case.

The output of the second adder 4 therefore indicates the number of bits that a burst must have to produce synchronisation. This information is sent to the control circuit 6 via the output T of a comparator 5 that compares this output of the second adder 4 with that of the counter 3.

Figure 2:
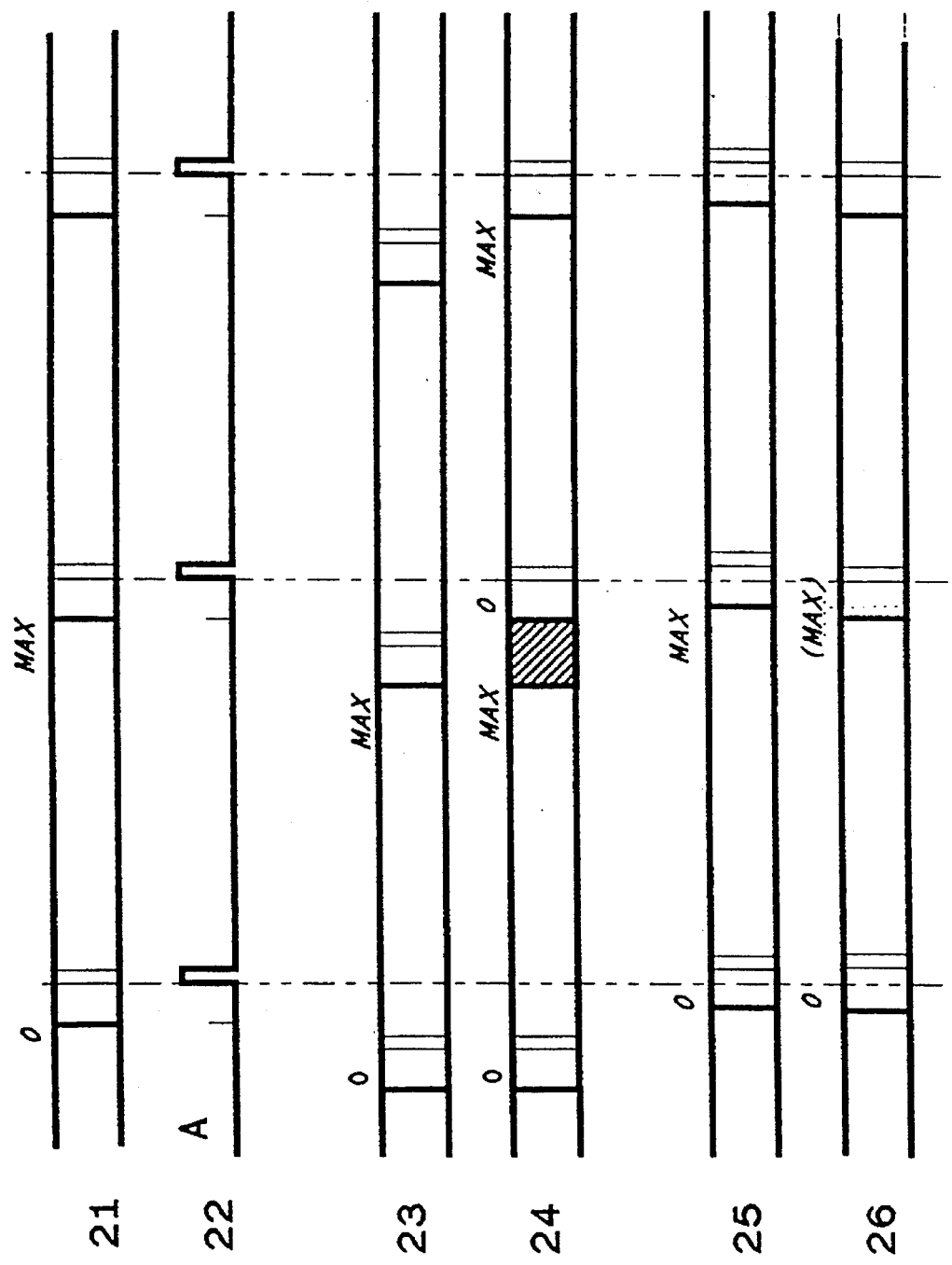
FIG. 2 shows timing diagrams which show how synchronisation is acquired in the timebases produced by means of the invention.

The control circuit 6 also generates a first initialisation signal RES_I that is applied to the counter 3 so that it reinitialises counting when a maximum value MAX is reached which is the value of the number of bits in each burst in the event that the internal timebase is already synchronised, or a different value indicated by the second adder in the event that synchronisation is in process. In this second case, the duration of the time slot is lengthened or shortened in order to obtain synchronisation as is indicated in FIG. 2, with the signals 24 and 26.

It also generates a second initialisation signal RES_2 that suppresses the content of the storage register 1 when the synchronisation process has already been completed.

What is claimed is:

1. A device for automatic synchronisation of dam bursts in a time division multiple access communication protocol, the device to compensate for drifting with respect to an external reference that generates an external timebase, the device for synchronizing an internal timebase corresponding to when a data burst can be accurately received and transmitted by a cordless terminal, the device comprising:

a) a counter (3) that cyclically counts, b) a control circuit (6) that receives a data signal (DAT) generated from the external reference on a periodic basis and for only some of the time, and that generates a burst reception signal (A) based upon the detection of the burst header in the data signal (DAT);

c) means responsive to the burst reception signal (A), the count of the counter (3), and a reference count (REF), representing the bit count when the burst reception signal (A) should be generated based upon the external timebase, for compensating the internal timebase based upon the difference between the count of the counter when the burst reception signal (A) was generated and the reference count (REF).

2. A device for automatic synchronisation of the internal timebase according to claim 1, characterised in that it comprises:

a storage register (1) that stores, upon receiving the burst reception signal (A), the value of the output signal of the counter (3), a first adder (2) that subtracts the previous value in the storage register (1) from a reference value (REF) which is a particular constant value depending on the protocol being used, and indicates the position in each frame where the burst reception signal (A) should occur; this adder (2) producing an output signal (DELTA) that indicates, as a number of bits, the shift between the timebase of the external reference and the internal timebase generated by the counter (3), a second adder (4) that performs the addition or the subtraction between a maximum value (MAX) corresponding to the total number of bits that constitutes each frame and the output signal (DELTA) of the first adder (2), depending on the enabling or disabling of a sum control signal (SUM) which is a function of whether the burst reception signal (A) has been received before or after the position it should occupy in the internal timebase, and a comparator (5) that compares the outputs corresponding to the counter (3) and to the second adder (4), producing a comparison signal (T) that is applied to the control circuit (6) which, upon receiving the comparison signal (T), initialises the counter (3) by applying a first initialisation signal (RES_1) to the counter (3) which results in a lengthening or shortening of the normal count value, thereby synchronising the internal timebase to the external reference.

3. A device for automatic synchronisation of the internal timebase according to claim 2, characterised in that the burst reception signal (A) is generated in the control circuit (6) from the detection of the header, or part thereof, of a data signal (DAT).

4. A device for automatic synchronisation of the internal timebase according to claim 2, characterised in that the shortening or lengthening of the corresponding time slot takes place not in the bit following the end of the time slot, but in a time slot reserved especially for this function, one in which no internal functions of the receiver are performed.

5. A method for automatic synchronisation of a first, internal timebase to an external reference, the synchronisation compensating for drift in the internal timebase with respect to the external reference, comprising the steps of:

obtaining a burst reception signal (A) through the detection of the burst header in a data signal (DAT) produced externally, measuring the difference in time, expressed as a number of bits, between the burst reception signal (A) and the instant when the internal timebase reaches a reference value (REF), the reference value (REF) indicating when the burst reception signal (A) should be detected, and re-initialising a count in a counter (3) when the counter reaches a value that is a maximum value (MAX), which is the normal length of a frame, to which is added or subtracted the difference in time, expressed as a number of bits, determined in the preceding step, so that the next frame is lengthened or shortened in order to synchronise the internal timebase to the external reference.

6. A method for automatic synchronisation of data bursts in a time division multiple access communication protocol in which communication frames are a constant maximum number of bits (MAX) including a header of a constant number of bits, upon which the value of a reference number (REF) is based, the method to compensate for drifting with respect to an external reference that generates an external timebase, the method synchronizing an internal timebase corresponding to when a data burst can be accurately received and transmitted by a cordless terminal, the method comprising the steps:

a) counting cyclically, from one to a variable number of bits according to the internal timebase;

b) listening, for only some of the time, for a data signal (DAT) provided periodically by the external reference;

c) determining, according to the internal timebase, in what bit position the last bit of the header occurs;

d) putting a burst reception signal (A) in the bit following the end of the header, which should be the reference number (REF) bit position;

d) determining the difference between the bit position of the burst reception signal (A) and the reference number (REF) bit position;

c) adjusting, for a frame, the variable number of bits counted to, in the cyclic counting, according to the difference found in the preceding step so that the header of the data signal (DAT) received after the adjustment will occur in the reference number (REF) bit position, according to the internal timebase.

\* \* \* \* \*

UNITED STATES PATENT AND TRADEMARK OFFICE
CERTIFICATE OF CORRECTION

PATENT NO. : 5,553,077
DATED : September 3, 1996
INVENTOR(S) : Martinez Garcia et al It is certified that error appears in the above-indentified patent and that said Letters Patent is hereby corrected as shown below:

At column 4, line 40 (claim 1, line 1), please cancel "dam" and substitute --data-- therefor.

Signed and Sealed this

Seventh Day of January, 1997

Attest:

BRUCE LEHMAN

*Attesting Officer*  *Commissioner of Patents and Trademarks*